(12) United States Patent
Morikazu et al.

(10) Patent No.: US 9,117,895 B2
(45) Date of Patent: Aug. 25, 2015

(54) LASER PROCESSING METHOD

(71) Applicant: Disco Corporation, Tokyo (JP)

(72) Inventors: Hiroshi Morikazu, Tokyo (JP); Noboru Takeda, Tokyo (JP)

(73) Assignee: Disco Corporation, Tokyo (JP)

( * ) Notice: Subject to any disclaimer, the term of this patent is extended or adjusted under 35 U.S.C. 154(b) by 4 days.

(21) Appl. No.: 14/154,706

(22) Filed: Jan. 14, 2014

(65) Prior Publication Data

US 2014/0213040 A1    Jul. 31, 2014

(30) Foreign Application Priority Data

Jan. 25, 2013   (JP) .................................. 2013-012209

(51) Int. Cl.
*H01L 21/78*    (2006.01)

(52) U.S. Cl.
CPC *H01L 21/78* (2013.01); *Y02E 10/50* (2013.01)

(58) Field of Classification Search
USPC ........................................................ 438/462
See application file for complete search history.

(56) References Cited

U.S. PATENT DOCUMENTS

2007/0023691 A1* 2/2007 Morishige et al. ......... 250/492.1
2012/0268817 A1* 10/2012 Kozlov .................... 359/485.05

FOREIGN PATENT DOCUMENTS

JP    10-305420    11/1998
JP    2002-192370    7/2002

* cited by examiner

*Primary Examiner* — Charles Garber
*Assistant Examiner* — Stanetta Isaac
(74) *Attorney, Agent, or Firm* — Greer, Burns & Crain, LTD

(57) ABSTRACT

A laser processing method for performing laser processing to a workpiece. The laser processing method includes: a filament forming step of applying a first pulsed laser beam having a transmission wavelength to the workpiece to thereby form a filament as an optical transmission line in the workpiece so that the filament extends from the surface of the workpiece to be irradiated with the first pulsed laser beam to the inside of the workpiece, the filament having a refractive index higher than that of the workpiece; and a laser processing step of applying a second pulsed laser beam to the filament after performing the filament forming step to thereby transmit the second pulsed laser beam along the filament, thereby processing the workpiece with the second pulsed laser beam.

9 Claims, 6 Drawing Sheets

LASER PROCESSING METHOD

BACKGROUND OF THE INVENTION

1. Field of the Invention

The present invention relates to a laser processing method of performing laser processing along a process line to the inside of a workpiece such as a semiconductor wafer and an optical device wafer.

2. Description of the Related Art

As well known in the art, in a semiconductor device fabrication process, a functional layer composed of an insulating film and a functional film is formed on the front side of a substrate such as a silicon substrate, and a plurality of semiconductor devices such as ICs and LSIs are formed like a matrix from this functional layer, thus obtaining a semiconductor wafer having the plural semiconductor devices. The plural semiconductor devices are partitioned by a plurality of crossing process lines called streets formed on the front side of the semiconductor wafer. The semiconductor wafer is divided along these streets to obtain the individual semiconductor devices.

Further, in an optical device fabrication process, an optical device wafer is provided by forming an optical device layer composed of an n-type nitride semiconductor layer and a p-type nitride semiconductor layer on the front side of a sapphire substrate or a silicon carbide substrate. The optical device layer is partitioned by a plurality of crossing streets to define a plurality of regions where a plurality of optical devices such as light emitting diodes and laser diodes are respectively formed. The optical device wafer is cut along the streets to thereby divide the regions where the optical devices are formed from each other, thus obtaining the individual optical devices.

As a method of dividing a workpiece such as a semiconductor wafer and an optical wafer along the streets, there has been tried a laser processing method of applying a pulsed laser beam having a transmission wavelength to the workpiece along the streets in the condition where the focal point of the pulsed laser beam is set inside the workpiece in a subject area to be divided. More specifically, this workpiece dividing method using laser processing includes the steps of applying a pulsed laser beam having a transmission wavelength to the workpiece from one side of the workpiece along the streets in the condition where the focal point of the pulsed laser beam is set inside the workpiece to thereby continuously form a modified layer inside the workpiece along each street and next applying an external force to the workpiece along each street where the modified layer is formed to be reduced in strength, thereby dividing the workpiece into the individual devices (see Japanese Patent No. 3408805, for example).

As another method of dividing a workpiece such as a semiconductor wafer and an optical device wafer along the streets, there has been put into practical use a technique including the steps of applying a pulsed laser beam having an absorption wavelength to the workpiece along the streets to thereby form a laser processed groove along each street by ablation and next applying an external force to the workpiece along each street where the laser processed groove is formed as a break start point, thereby breaking the workpiece along each street (see Japanese Patent Laid-open No. Hei 10-305420, for example).

SUMMARY OF THE INVENTION

In forming a modified layer inside a wafer in the condition where the focal point of a laser beam is set inside the wafer, it is necessary to use a focusing lens having a numerical aperture (NA) of about 0.8. Accordingly, to divide a wafer having a thickness of 300 µm, for example, into individual devices, a plurality of modified layers stacked must be formed along each street, causing a reduction in productivity.

Further, in the case of applying a pulsed laser beam having an absorption wavelength to a wafer, ablation occurs near the surface of the wafer irradiated with the pulsed laser beam, so that the energy of the pulsed laser beam does not penetrate into the inside of the wafer. Accordingly, the pulsed laser beam must be applied plural times along each street, causing a reduction in productivity.

It is therefore an object of the present invention to provide a laser processing method which can process a workpiece so that it is breakable along a process line, by twice applying a pulsed laser beam along the process line.

In accordance with an aspect of the present invention, there is provided a laser processing method of performing laser processing to a workpiece. The method includes: a filament forming step of applying a first pulsed laser beam having a transmission wavelength to the workpiece to thereby form a filament as an optical transmission line in the workpiece so that the filament extends from the surface of the workpiece to be irradiated with the first pulsed laser beam to the inside of the workpiece, the filament having a refractive index higher than that of the workpiece; and a laser processing step of applying a second pulsed laser beam to the filament after performing the filament forming step to thereby transmit the second pulsed laser beam along the filament, thereby processing the workpiece with the second pulsed laser beam.

Preferably, the first pulsed laser beam to be applied in the filament forming step is focused at a position slightly inside the workpiece from the surface of the workpiece to be irradiated with the first pulsed laser beam. Preferably, the first pulsed laser beam to be applied in the filament forming step is focused by using a focusing lens having a numerical aperture (NA) set to 0.2 to 0.3.

Preferably, the first pulsed laser beam is applied at predetermined intervals along a process line in the filament forming step, thereby forming a plurality of filaments arranged at the predetermined intervals along each process line, each filament having a refractive index higher than that of the workpiece. Further, the second pulsed laser beam to be applied in the laser processing step is guided along each filament to the inside of the workpiece to thereby form a break layer along each filament.

As described above, the laser processing method according to the present invention includes the filament forming step of applying a first pulsed laser beam having a transmission wavelength to a workpiece to thereby form a filament as an optical transmission line in the workpiece so that the filament extends from the surface (upper surface) of the workpiece to be irradiated with the first pulsed laser beam to the inside of the workpiece, the filament having a refractive index higher than that of the workpiece, and the laser processing step of applying a second pulsed laser beam to the filament after performing the filament forming step to thereby transmit the second pulsed laser beam along the filament, thereby processing the workpiece with the second pulsed laser beam. Accordingly, the second pulsed laser beam to be applied in the laser processing step is guided along the filament as an optical transmission line formed in the filament forming step, wherein the refractive index of the filament is higher than that of the workpiece, so that the workpiece can be processed over the thickness from the upper surface to the lower surface thereof by the second pulsed laser beam. That is, the workpiece can be processed by twice applying a pulsed laser beam in the filament forming step and the laser processing step. Accordingly, even when the thickness of the workpiece is large, the productivity can be greatly improved.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
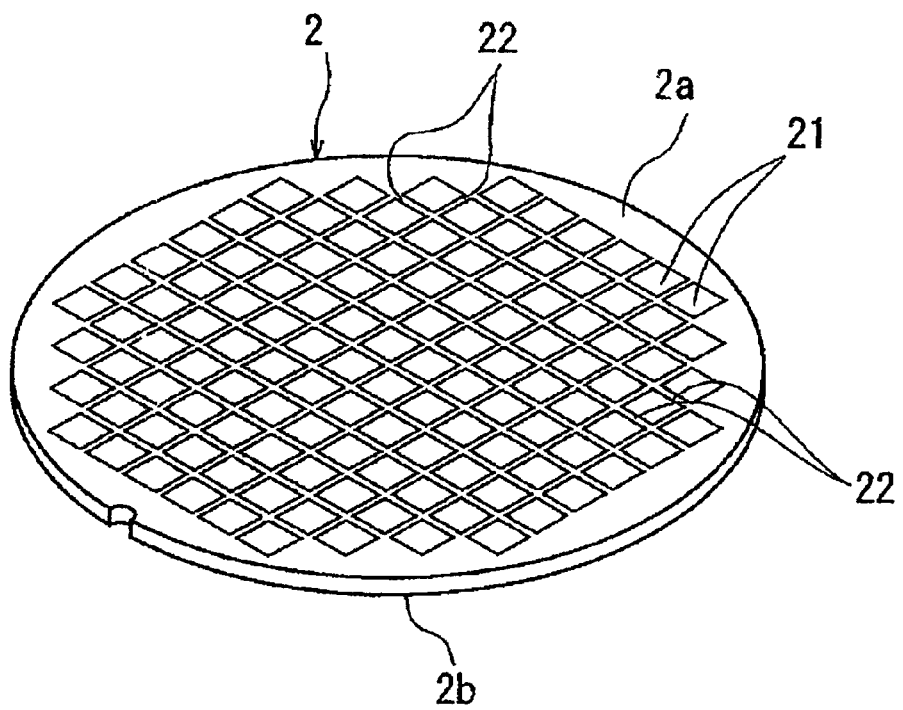
FIG. 1 is a perspective view of an optical device wafer as a workpiece to be processed by the laser processing method according to the present invention.

The laser processing method according to the present invention will now be described in detail with reference to the attached drawings. FIG. 1 is a perspective view of an optical device wafer 2 as a workpiece to be processed by the laser processing method according to the present invention. The optical device wafer 2 shown in FIG. 1 is composed of a sapphire substrate having a thickness of 300 µm, for example, and a plurality of optical devices 21 such as light emitting diodes and laser diodes formed on the front side 2a of the sapphire substrate so as to be arranged like a matrix. These optical devices 21 are partitioned by a plurality of crossing process lines 22 called streets formed on the front side 2a of the sapphire substrate, i.e., the front side of the optical device wafer 2.

Figure 2:
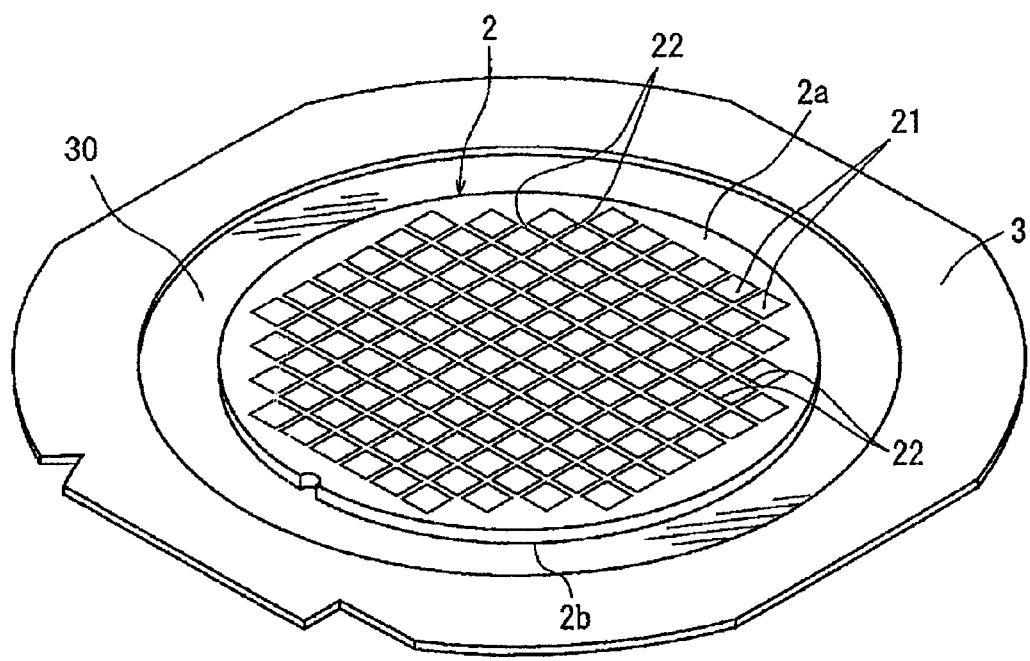
FIG. 2 is a perspective view showing a condition where the optical device wafer shown in FIG. 1 is attached to a dicing tape supported to an annular frame.

There will now be described a laser processing method of performing laser processing along the process lines 22 to divide the optical device wafer 2 along the process lines 22. First, a wafer supporting step is performed in such a manner that the optical device wafer 2 is attached to a dicing tape supported to an annular frame. More specifically, as shown in FIG. 2, a dicing tape 30 is supported at its peripheral portion to an annular frame 3 so as to close the inside opening of the annular frame 3. The back side 2b of the sapphire substrate, i.e., the back side of the optical device wafer 2 is attached to the front side (upper surface) of the dicing tape 30 supported to the annular frame 3.

Figure 3:
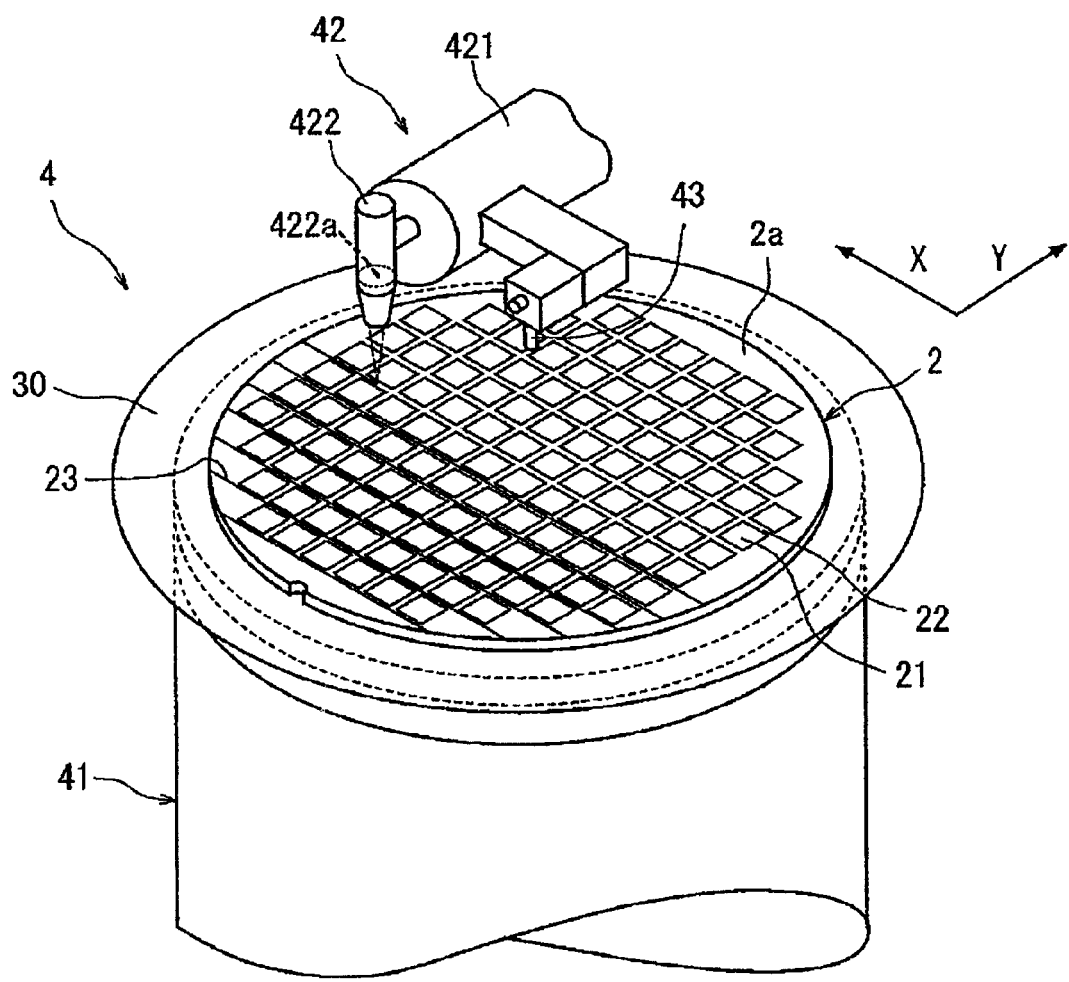
FIG. 3 is a perspective view of an essential part of a laser processing apparatus for performing a filament forming step.

After performing the wafer supporting step mentioned above, a filament forming step is performed in such a manner that a pulsed laser beam having a transmission wavelength to the sapphire substrate constituting the optical device wafer 2 as a workpiece is applied along each process line 22 to thereby form a filament as an optical transmission line in the sapphire substrate so that the filament extends from the front side 2a (the upper surface of the sapphire substrate to be irradiated with the pulsed laser beam) to the inside of the sapphire substrate, the filament having a refractive index higher than that of the sapphire substrate. This filament forming step is performed by using a laser processing apparatus 4 shown in FIG. 3. As shown in FIG. 3, the laser processing apparatus 4 includes a chuck table 41 for holding a workpiece, laser beam applying means 42 for applying a laser beam to the workpiece held on the chuck table 41, and imaging means 43 for imaging the workpiece held on the chuck table 41. The chuck table 41 has an upper surface as a holding surface for holding the workpiece thereon under suction. The chuck table 41 is movable both in the feeding direction shown by an arrow X in FIG. 3 by feeding means (not shown) and in the indexing direction shown by an arrow Y in FIG. 3 by indexing means (not shown).

The laser beam applying means 42 includes a cylindrical casing 421 extending in a substantially horizontal direction. Although not shown, the casing 421 contains pulsed laser beam generating means including a pulsed laser beam oscillator and repetition frequency setting means. The laser beam applying means 42 further includes focusing means 422 mounted on the front end of the casing 421. The focusing means 422 has a focusing lens 422a for focusing a pulsed laser beam generated by the pulsed laser beam generating means. It is important that the numerical aperture (NA) of the focusing lens 422a of the focusing means 422 is set in the range of 0.2 to 0.3. In this preferred embodiment, the numerical aperture (NA) of the focusing lens 422a is set to 0.25. The laser beam applying means 42 further includes focal position adjusting means (not shown) for adjusting the focal position of the pulsed laser beam to be focused by the focusing means 422.

The imaging means 43 is mounted on a front end portion of the casing 421 constituting the laser beam applying means 42 and includes illuminating means for illuminating the workpiece, an optical system for capturing an area illuminated by the illuminating means, and an imaging device (CCD) for imaging the area captured by the optical system. An image signal output from the imaging means 43 is transmitted to control means (not shown).

There will now be described with reference to FIG. 3 and FIGS. 4A to 4C the filament forming step of applying a pulsed laser beam having a transmission wavelength to the sapphire substrate constituting the optical device wafer 2 along each process line 22 by using the laser processing apparatus 4 mentioned above to thereby form a filament as an optical transmission line in the sapphire substrate so that the filament extends from the front side 2a (the upper surface of the sapphire substrate to be irradiated with the pulsed laser beam) to the inside of the sapphire substrate, the filament having a refractive index higher than that of the sapphire substrate.

First, the optical device wafer 2 is placed on the chuck table 41 of the laser processing apparatus 4 in the condition where the dicing tape 30 attached to the optical device wafer 2 is in contact with the chuck table 41 as shown in FIG. 3. Thereafter, suction means (not shown) is operated to hold the optical device wafer 2 through the dicing tape 30 on the chuck table 41 under suction (wafer holding step). Accordingly, the front side 2a of the optical device wafer 2 held on the chuck table 41 is oriented upward. Although the annular frame 3 supporting the dicing tape 30 is not shown in FIG. 3, the annular frame 3 is held by suitable frame holding means provided on the chuck table 41. Thereafter, the chuck table 41 holding the optical device wafer 2 is moved to a position directly below the imaging means 43 by operating the feeding means (not shown).

In the condition where the chuck table 41 is positioned directly below the imaging means 43, an alignment operation is performed by the imaging means 43 and the control means (not shown) to detect a subject area of the optical device wafer 2 to be laser-processed. More specifically, the imaging means 43 and the control means perform image processing such as pattern matching for making the alignment of the process lines 22 extending in a first direction on the optical device wafer 2 and the focusing means 422 of the laser beam applying means 42 for applying the laser beam to the wafer 2 along the process lines 22, thus performing the alignment of a laser beam applying position (alignment step). Similarly, this alignment step is performed for the other process lines 22 extending in a second direction perpendicular to the first direction on the optical device wafer 2.

Figure 4A:
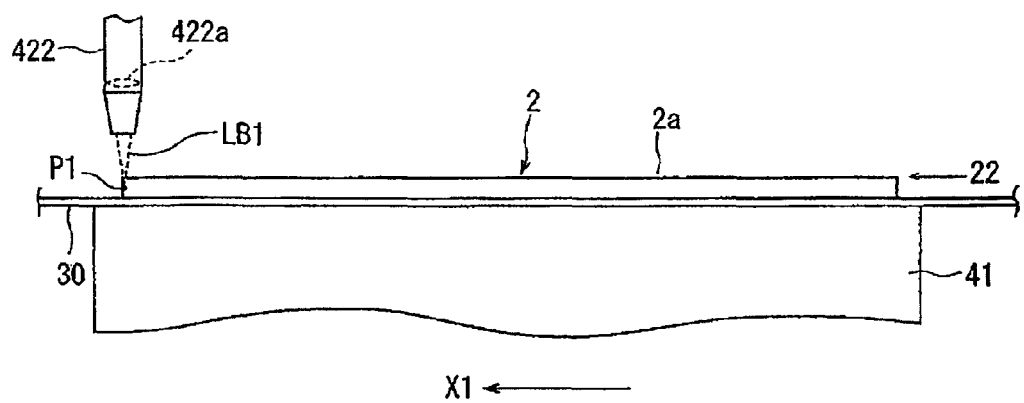
FIGS. 4A to 4C are views for illustrating the filament forming step.
Figure 4B:
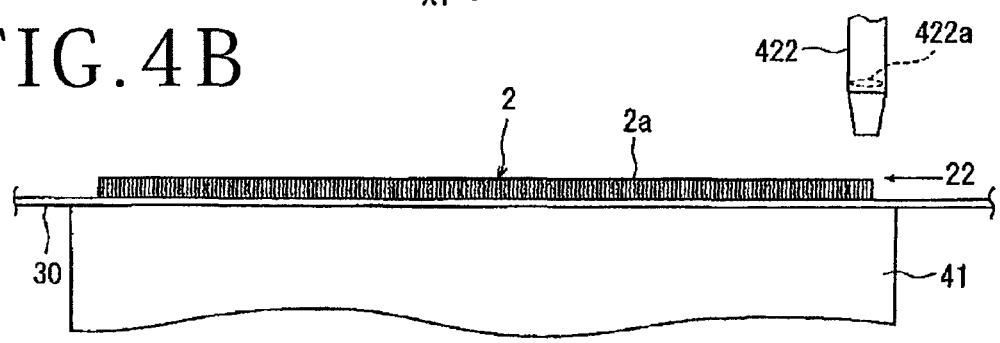
Figure 4C:
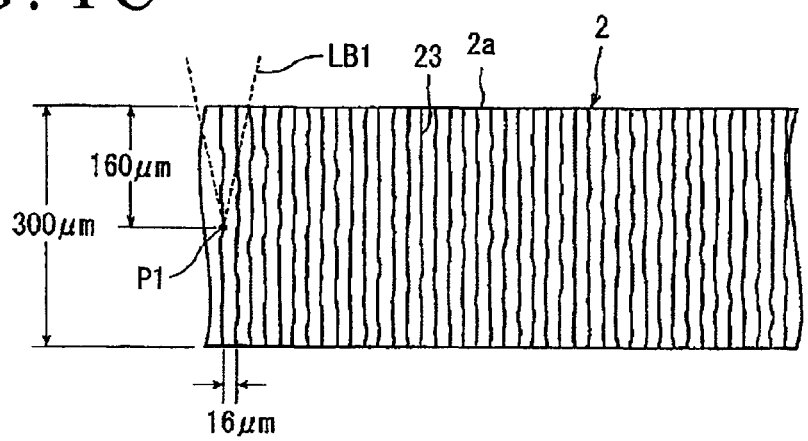

After performing the alignment step mentioned above for all of the process lines 22, the chuck table 41 is moved to a laser beam applying area where the focusing means 422 of the laser beam applying means 42 is located as shown in FIG. 4A, thereby positioning one end (left end as viewed in FIG. 4A) of a predetermined one of the process lines 22 extending in the first direction directly below the focusing means 422. Further, the focal point P1 of a pulsed laser beam LB1 to be applied from the focusing means 422 is set at a position slightly below the front side 2a (upper surface) of the optical device wafer 2 as the pulsed laser beam applied surface. In the present embodiment, the focal point P1 of the pulsed laser beam LB1 is set at a position below the front side 2a of the optical device wafer 2 by 160 μm as shown in FIG. 4C. Thereafter, the pulsed laser beam LB1 having a transmission wavelength to the sapphire substrate is applied from the focusing means 422 to the wafer 2, and the chuck table 41 is moved in the direction shown by an arrow X1 in FIG. 4A at a predetermined feed speed (filament forming step). When the other end (right end as viewed in FIG. 4B) of the predetermined process line 22 reaches the position directly below the focusing means 422 as shown in FIG. 4B, the application of the pulsed laser beam LB1 is stopped and the movement of the chuck table 41 is also stopped.

For example, the filament forming step mentioned above is performed under the following processing conditions.

Wavelength of the pulsed laser beam LB1: 1030 nm
Repetition frequency: 50 kHz
Pulse width: 10 ps
Average power: 3 W
Numerical aperture (NA) of the focusing lens: 0.25
Focused spot diameter: 10 μm
Focus: −160 μm (defocused on the laser beam applied surface)
Work feed speed: 800 mm/s By performing the filament forming step under the above-mentioned processing conditions, a plurality of filaments 23 are formed inside the optical device wafer 2 so as to extend from the front side 2a (upper surface) to the back side 2b (lower surface) in such a manner that the plural filaments 23 are arranged along the predetermined process line 22 at predetermined intervals, e.g., 16 μm intervals (=(work feed speed: 800 mm/s)/(repetition frequency: 50 kHz)) as shown in FIG. 4C, wherein each filament 23 has a refractive index higher than that of the sapphire substrate constituting the optical device wafer 2. Each filament 23 functions as an optical transmission line in a laser processing step to be hereinafter described.

After performing the filament forming step along the predetermined process line 22 as mentioned above, the chuck table 41 is moved in the indexing direction shown by the arrow Y in FIG. 3 by the pitch of the process lines 22 formed on the optical device wafer 2 (indexing step), and the filament forming step is similarly performed along the next process line 22 extending in the first direction. In this manner, the filament forming step is performed along all of the process lines 22 extending in the first direction. Thereafter, the chuck table 41 is rotated 90 degrees to similarly perform the filament forming step along all of the other process lines 22 extending in the second direction perpendicular to the first direction.

Figure 5:
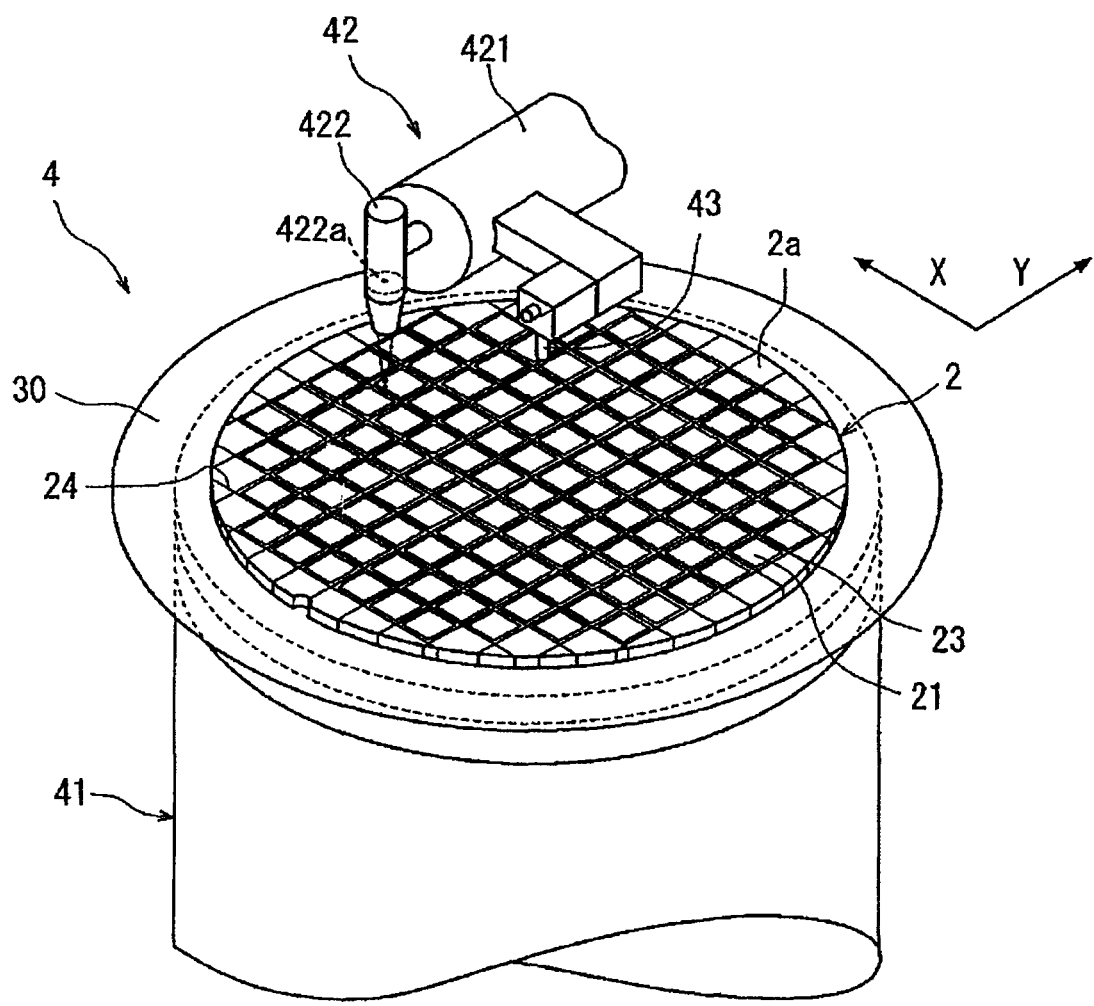
FIG. 5 is a perspective view of an essential part of a laser processing apparatus for performing a laser processing step.

After finishing the filament forming step mentioned above, a laser processing step is performed in such a manner that a pulsed laser beam for processing the workpiece processed by the filament forming step is applied to each filament 23 and thereby transmitted along each filament 23. This laser processing step may be performed by using a laser processing apparatus similar to the laser processing apparatus 4 shown in FIG. 3. Such a similar laser processing apparatus is shown in FIG. 5 and the same reference symbols as those shown in FIG. 3 are used in FIG. 5 for convenience of illustration. In performing the laser processing step, the optical device wafer 2 processed by the filament forming step is placed on the chuck table 41 in the condition where the dicing tape 30 attached to the wafer 2 is in contact with the chuck table 41 as shown in FIG. 5. Thereafter, suction means (not shown) is operated to hold the optical device wafer 2 through the dicing tape 30 on the chuck table 41 under suction (wafer holding step). Accordingly, the front side 2a of the optical device wafer 2 held on the chuck table 41 is oriented upward. Although the annular frame 3 supporting the dicing tape 30 is not shown in FIG. 5, the annular frame 3 is held by suitable frame holding means provided on the chuck table 41. Thereafter, the chuck table 41 holding the optical device wafer 2 is moved to a position directly below the imaging means 43 by operating the feeding means (not shown). Thereafter, an alignment step is performed in the same manner as that mentioned above.

Figure 6A:
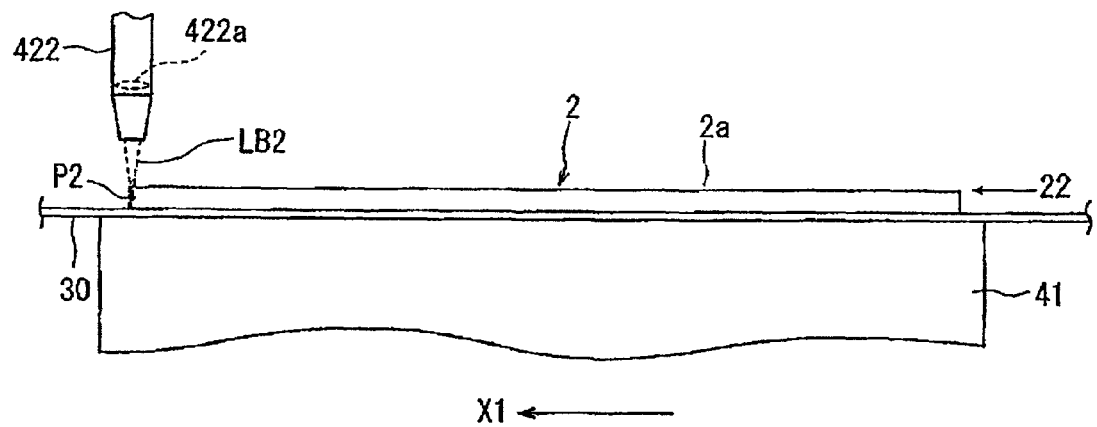
FIGS. 6A to 6C are views for illustrating the laser processing step.
Figure 6B:
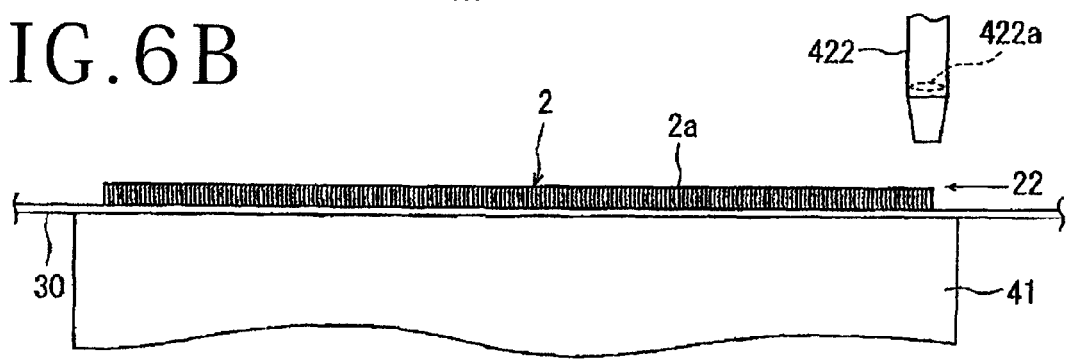

Thereafter, the chuck table 41 is moved to a laser beam applying area where the focusing means 422 of he laser beam applying means 42 is located as shown in FIG. 6A, thereby positioning a predetermined one of the process lines 22 extending in the first direction directly below the focusing means 422. At this time, one end (left end as viewed in FIG. 6A) of the predetermined process line 22 is positioned directly below the focusing means 422. Further, the focal point P2 of a pulsed laser beam LB2 to be applied from the focusing means 422 is set on the front side 2a (upper surface) of the optical device wafer 2. Thereafter, the pulsed laser beam LB2 having an absorption wavelength to the sapphire substrate of the optical device wafer 2 is applied from the focusing means 422 to the wafer 2, and the chuck table 41 is moved in the direction shown by an arrow X1 in FIG. 6A at a predetermined feed speed (laser processing step). When the other end (right end as viewed in FIG. 6B) of the predetermined process line 22 reaches the position directly below the focusing means 422 as shown in FIG. 6B, the application of the pulsed laser beam LB2 is stopped and the movement of the chuck table 41 is also stopped.

For example, the laser processing step mentioned above is performed under the following processing conditions.

Figure 6C:
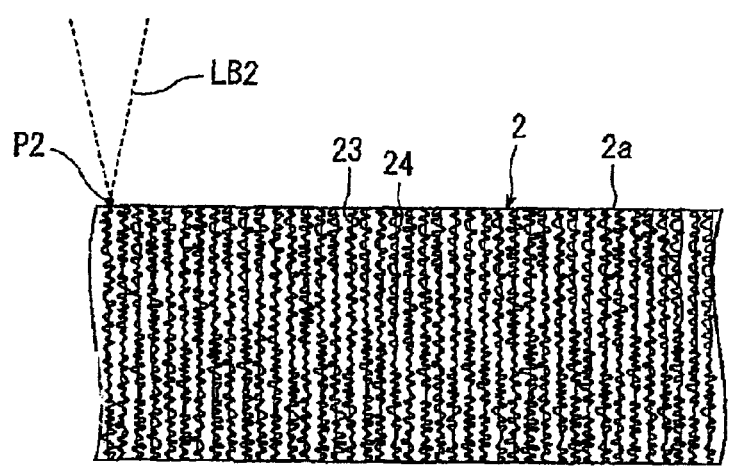

Wavelength of the pulsed laser beam LB2: 355 nm
Repetition frequency: 10 kHz
Pulse width: 10 ps
Average power: 7 W
Numerical aperture (NA) of the focusing lens: 0.25
Focused spot diameter: 10 μm
Focus: 0 μm (just focused on the incident surface of the wafer)
Work feed speed: 100 mm/s In the above-mentioned processing conditions, the pulsed laser beam LB2 having a focused spot diameter of 10 μm is applied along the predetermined process line 22 at 10 μm intervals (=(work feed speed: 100 mm/s)/(repetition frequency: 10 kHz)). Accordingly, the pulsed laser beam LB2 can be applied to the plural filaments 23 arranged along each process line 22 at 16 μm intervals. As described above, each filament 23 has a refractive index higher than that of the sapphire substrate constituting the optical device wafer 2. Accordingly, when the pulsed laser beam LB2 is applied to each filament 23 along the predetermined process line 22 on the front side 2a (upper surface) of the optical device wafer 2, the pulsed laser beam LB2 is guided by each filament 23 to thereby form a break layer 24 along each filament 23 as shown in FIG. 6C. In this manner, the pulsed laser beam LB2 applied in the laser processing step is guided by each filament 23 as an optical transmission line having a refractive index higher than that of the sapphire substrate, so that the break layer 24 can be formed inside the optical device wafer 2 so as to extend from the front side 2a (upper surface) to the back side 2b (lower surface) of the wafer 2, thereby greatly improving the productivity. Each break layer 24 formed inside the wafer 2 has a reduced strength.

After performing the laser processing step along the predetermined process line 22 as mentioned above, the chuck table 41 is moved in the indexing direction shown by the arrow Y in FIG. 5 by the pitch of the process lines 22 formed on the optical device wafer 2 (indexing step), and the laser processing step is similarly performed along the next process line 22 extending in the first direction. In this manner, the laser processing step is performed along all of the process lines 22 extending in the first direction. Thereafter, the chuck table 41 is rotated 90 degrees to similarly perform the laser processing step along all of the other process lines 22 extending in the second direction perpendicular to the first direction.

Thereafter, the optical device wafer 2 processed by the filament forming step and the laser processing step as mentioned above is transported to a wafer dividing apparatus (not shown) for performing a wafer dividing step of breaking the optical device wafer 2 along each process line 22 where the plural break layers 24 are formed. In the wafer dividing step, an external force is applied along each process line 22 where the plural break layers 24 are formed, thereby easily breaking the optical device wafer 2 along the plural break layers 24 reduced in strength. Thusly, the optical device wafer 2 is divided into the individual optical devices 21.

While a specific preferred embodiment of the present invention has been described above, the present invention is not limited to the above preferred embodiment, but various modifications may be made within the scope of the present invention. For example, while the laser beam in each step of the above preferred embodiment is applied to the optical device wafer so as to enter the front side of the sapphire substrate constituting the wafer, the laser beam may enter the back side of the sapphire substrate. Further, while the optical device wafer is divided into the individual optical devices in the above preferred embodiment, the present invention is applicable also to the case of forming fine holes in a glass plate.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing method of performing laser processing to a workpiece, comprising:
    a filament forming step of applying a first pulsed laser beam having a transmission wavelength to said workpiece to thereby form a filament as an optical transmission line in said workpiece so that said filament extends from the surface of said workpiece to be irradiated with said first pulsed laser beam to the inside of said workpiece, said filament having a refractive index higher than that of said workpiece; and
    a laser processing step of applying a second pulsed laser beam to said filament after performing said filament forming step to thereby transmit said second pulsed laser beam along said filament, thereby processing said workpiece with said second pulsed laser beam.

2. The laser processing method according to claim 1, wherein said first pulsed laser beam to be applied in said filament forming step is focused at a position slightly inside said workpiece from the surface of said workpiece to be irradiated with said first pulsed laser beam.

3. The laser processing method according to claim 1, wherein said first pulsed laser beam to be applied in said filament forming step is focused by using a focusing lens having a numerical aperture (NA) set to 0.2 to 0.3.

4. The laser processing method according to claim 3, wherein said first pulsed laser beam is applied at predetermined intervals along a process line in said filament forming step, thereby forming a plurality of filaments arranged at said predetermined intervals along each process line, each filament having a refractive index higher than that of said workpiece.

5. The laser processing method according to claim 4, wherein said second pulsed laser beam to be applied in said laser processing step is guided along each filament to the inside of said workpiece to thereby form a break layer along each filament.

6. The laser processing method according to claim 1, wherein said filament forming step forms a plurality of said filaments within said workpiece.

7. The laser processing method according to claim 1, wherein said workpiece includes a sapphire substrate, and further wherein said filament extends across the entire thickness of said sapphire substrate.

8. The laser processing method according to claim 1, wherein said workpiece includes a sapphire substrate, and further wherein said filament extends within said sapphire substrate.

9. The laser processing method according to claim 1, wherein said filament is formed directly below where the first pulsed laser beam has been applied.

* * * * *